(12) United States Patent
Kono (10) Patent No.: US 7,800,387 B2
(45) Date of Patent: Sep. 21, 2010

(54) METHOD FOR DETECTING TIPS OF PROBES, ALIGNMENT METHOD AND STORAGE MEDIUM STORING THE METHODS, AND PROBE APPARATUS

(75) Inventor: Yoshinao Kono, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 402 days.

(21) Appl. No.: 11/756,281

(22) Filed: May 31, 2007

(65) Prior Publication Data

US 2007/0296427 A1 Dec. 27, 2007

(30) Foreign Application Priority Data

May 31, 2006 (JP) ............................. 2006-152302

(51) Int. Cl.
*G01R 31/02* (2006.01)
(52) U.S. Cl. ...................................... 324/758
(58) Field of Classification Search ......... 324/754–765; 438/14–17
See application file for complete search history.

(56) References Cited

U.S. PATENT DOCUMENTS

| | | | | |
|---|---|---|---|---|
| 4,328,553 A * | 5/1982 | Fredriksen et al. | ...... | 356/139.04 |
| 5,321,352 A * | 6/1994 | Takebuchi | ................. | 324/758 |
| 5,640,101 A * | 6/1997 | Kuji et al. | ................. | 324/754 |
| 5,642,056 A | 6/1997 | Nakajima et al. | | |
| 5,742,173 A * | 4/1998 | Nakagomi et al. | .......... | 324/758 |
| 5,804,983 A | 9/1998 | Nakajima et al. | | |
| 6,501,289 B1 * | 12/2002 | Takekoshi | ................... | 324/758 |
| 6,774,651 B1 * | 8/2004 | Hembree | .................... | 324/758 |
| 6,906,542 B2 | 6/2005 | Sakagawa et al. | | |
| 7,135,883 B2 * | 11/2006 | Komatsu | .................... | 324/765 |
| 7,262,618 B2 | 8/2007 | Komatsu | | |
| 2004/0140820 A1 * | 7/2004 | Sakagawa et al. | ........... | 324/754 |
| 2006/0114008 A1 * | 6/2006 | Fujii | ............................ | 324/754 |
| 2008/0315904 A1 * | 12/2008 | Ishii | ............................ | 324/758 |

FOREIGN PATENT DOCUMENTS

| | | |
|---|---|---|
| JP | 7-231018 | 8/1995 |
| JP | 2005-12119 | 1/2005 |
| KR | 2003-0082992 | 10/2003 |

* cited by examiner

*Primary Examiner*—Ha Tran T Nguyen
*Assistant Examiner*—Arleen M Vazquez
(74) *Attorney, Agent, or Firm*—Oblon, Spivak, McClelland, Maier & Neustadt, L.L.P.

(57) ABSTRACT

There is provided a method for detecting a height of a tip of a probe before detecting a horizontal position of the probe tips of the probe, by using an alignment device having a first imaging unit and a second imaging unit provided at the mounting table. In the method, at a first step, a height of a load sensor provided in the mounting table is detected by using the first imaging unit. Further, at a second step, the mounting table is moved to make the probe come in contact with the load sensor and a height of the probe tip is detected based on a moving amount of the mounting table. In addition, it is confirmed whether the load sensor operates normally by using a pin, between the first and the second step.

17 Claims, 6 Drawing Sheets

METHOD FOR DETECTING TIPS OF PROBES, ALIGNMENT METHOD AND STORAGE MEDIUM STORING THE METHODS, AND PROBE APPARATUS

FIELD OF THE INVENTION

The present inventions relate to a method for detecting probe tips and an alignment method, which are used when inspecting electrical characteristics of a target object such as a semiconductor wafer, a storage medium storing these methods therein, and a probe apparatus; and, more particularly, to a method for precisely detecting a height of probe tip regardless of a kind of a probe card and an alignment method, prior to inspecting a target object, a storage medium storing these methods therein, and a probe apparatus.

BACKGROUND OF THE INVENTION

Figure 5:
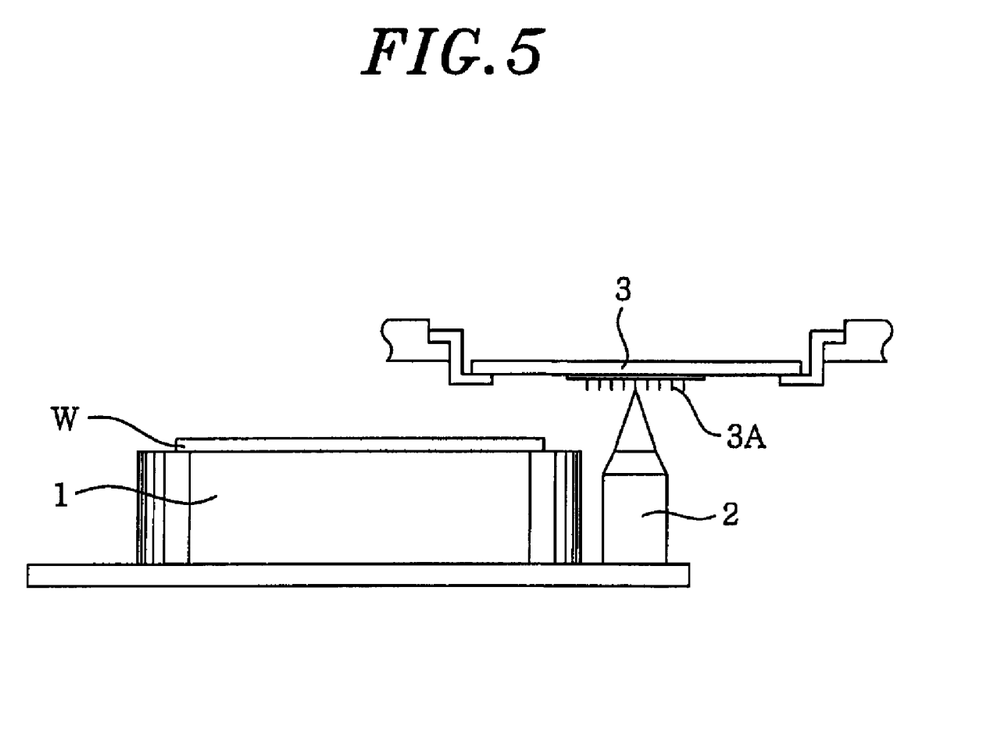
FIG. 5 shows a schematic diagram illustrating an example of a conventional alignment method.

When electrical characteristics of a target object such as a semiconductor wafer are inspected by using a probe card, as shown in FIG. 5 for example, tips of a plurality of probes 3A provided in the probe card 3 are imagined by a camera 2 installed at a side of the mounting table 1 for mounting thereon the target object (e.g., a wafer W) to detect the height of tips of probes 3A and electrodes of the wafer W are imagined by a separate camera to detect the height of the electrodes.

Then, the mounting table 1 is moved toward the probe card 3 based on the detected heights. The electrodes of the wafer W are made to come into contact with the probes 3A and be overdriven by a specific level, so that the electrical contacts are made therebetween under a specific contact pressure and inspection is carried out. If the contact pressure of the probes 3A is not sufficient, inspection results will be failed. If the contact pressure of the probes 3A is excessive, the probe card will be damaged.

In Japanese Patent Laid-open Application No. 2005-012119 (Reference Document 1) for example, there has been proposed a technology that after a wafer and a probe are aligned in X, Y directions, a height of tips of the probes is precisely detected to make an overdrive amount constant. In this technology, after measuring a height of a load sensor by using a laser measuring device, an ascending amount of the load sensor to come in contact with the tips of the probes is calculated, thereby obtaining a contact starting point (a height of the tips) of the probes. A height of electrodes of the wafer is measured by the laser measuring device, and the wafer is ascended, based on the difference between the height of the electrodes and the load sensor, up to the contact starting point, and then the probes are then made to come in contact with the corresponding electrodes under a constant amount of overdrive.

Further, Japanese Patent Laid-open Application No. H06-163651 (Reference Document 2) discloses a technology for detecting a contact pressure between probe needles and electrodes of a semiconductor wafer, by using a pressure sensor provided on the top surface of a wafer chuck. Until a plurality of probes are put in contact with the semiconductor wafer with a specific contact pressure, the wafer chuck ascends up to a height where the probes come in contact with corresponding electrodes of the wafer with the specific contact pressure, and inspection is performed while the wafer chuck is set to be located at the height level. As a result, the electrodes of the wafer can be put in contact with the probe needles under the specific contact pressure, thereby enhancing the reliability of the inspection.

However, recently, various types of probe cards are used, so that it becomes difficult to detect probe tips by an optical alignment method using a camera depending on materials or shapes of the probes.

The technology disclosed in Reference Document 1 is for detecting precisely a contact starting point by using a laser measuring device to set an amount of overdrive constantly and precisely, not for detecting directly a height of probe tips before an alignment of the probes. Further, the technology disclosed in Reference Document 2 is for setting a contact pressure to a specific value, not for detecting a height of probe tips upon an alignment thereof.

SUMMARY OF THE INVENTION

It is, therefore, an object of the present invention to provide a method for detecting tips of probes and an alignment method, a storage media that those methods are recorded, and a probe apparatus, wherein a height of the probe tips of a probe card can be detected certainly and precisely upon an alignment thereof with respect to any type of probe card, regardless of an optical unit, without teaching a position of the probe card.

In accordance with a first aspect of the present invention, there is provided a method for detecting a height of tips of probes before detecting a horizontal position of the probe tips by using an alignment device having a first imaging unit and a second imaging unit provided at a movable mounting table, the method including the steps of: (a) detecting a height of a load sensor provided at the mounting table by using the first imaging unit; and (b) moving the mounting table to make the probe come in contact with the load sensor and detecting a height of the probe tip based on a moving amount of the mounting table.

Preferable, it is confirmed whether the load sensor operates normally by using a pin, between the steps (a) and (b).

Further, it is preferable that a height of the pin is detected by using the second imaging unit prior to the step (a).

Further, the height of the load sensor may be confirmed again by using the first imaging unit.

In accordance with a second aspect of the present invention, there is provided an alignment method for performing position alignment of a plurality of probes arranged above a movable mounting table, by using an alignment device having a first imaging unit and a second imaging unit provided at the movable mounting table, the method including the steps of: (a) moving the mounting table to make a load sensor provided at the mounting table come in contact with the probes and detecting a height of tips of the probes based on a moving amount of the mounting table; and (b) moving the mounting table based on the height of the tips of the probes and detecting a horizontal position of the tips of the probes by using the second imaging unit.

It is preferable that a height of the load sensor is detected by using the first imaging unit prior to the step (a).

Preferably, it is confirmed whether the load sensor operates normally by using the second imaging unit prior to detecting the height of the load sensor.

Further, a height of the pin may be detected by using the second imaging unit prior to confirming the operation of the load sensor.

Preferably, the height of the load sensor is confirmed again by using the first imaging unit.

In accordance with a third aspect of the present invention, there is provided a computer executable storage medium for performing the method in accordance with the first aspect of the present invention.

In accordance with a fourth aspect of the present invention, there is provided a computer executable storage medium for performing the method in accordance with the second aspect of the present invention.

In accordance with a fifth aspect of the present invention, there is provided a probe apparatus including: a movable mounting table for mounting thereon an object to be inspected; a plurality of probes arranged above the mounting table; an alignment device for performing position alignment of the probes and the object to be inspected placed on the mounting table, wherein the alignment device includes a first imaging unit and a second imaging unit provided at the mounting table; a load sensor provided at the mounting table; and a pin for confirming whether the weight load operates normally.

It is preferable that the load sensor may includes a sensor unit for detecting a load; a driving unit for moving the sensor unit between a first position and a second position; and sensors for detecting the first and the second position, and wherein the sensor unit has a load receiving part which moves elastically under the load and a sensor (include switch type sensor) pressed by the movement of the load receiving part.

In accordance with the present invention, there are provided a method for detecting tips of probes and an alignment method, a storage medium storing the methods therein, and a probe apparatus, wherein a height of the probe tips of a probe card can be detected certainly and precisely upon an alignment thereof with respect to any type of probe card, regardless of an optical unit, without teaching a position of a probe card.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Hereinafter, embodiments of the present invention will be described with reference to the accompanying drawings, FIGS. 1 to 4F.

Figure 1:
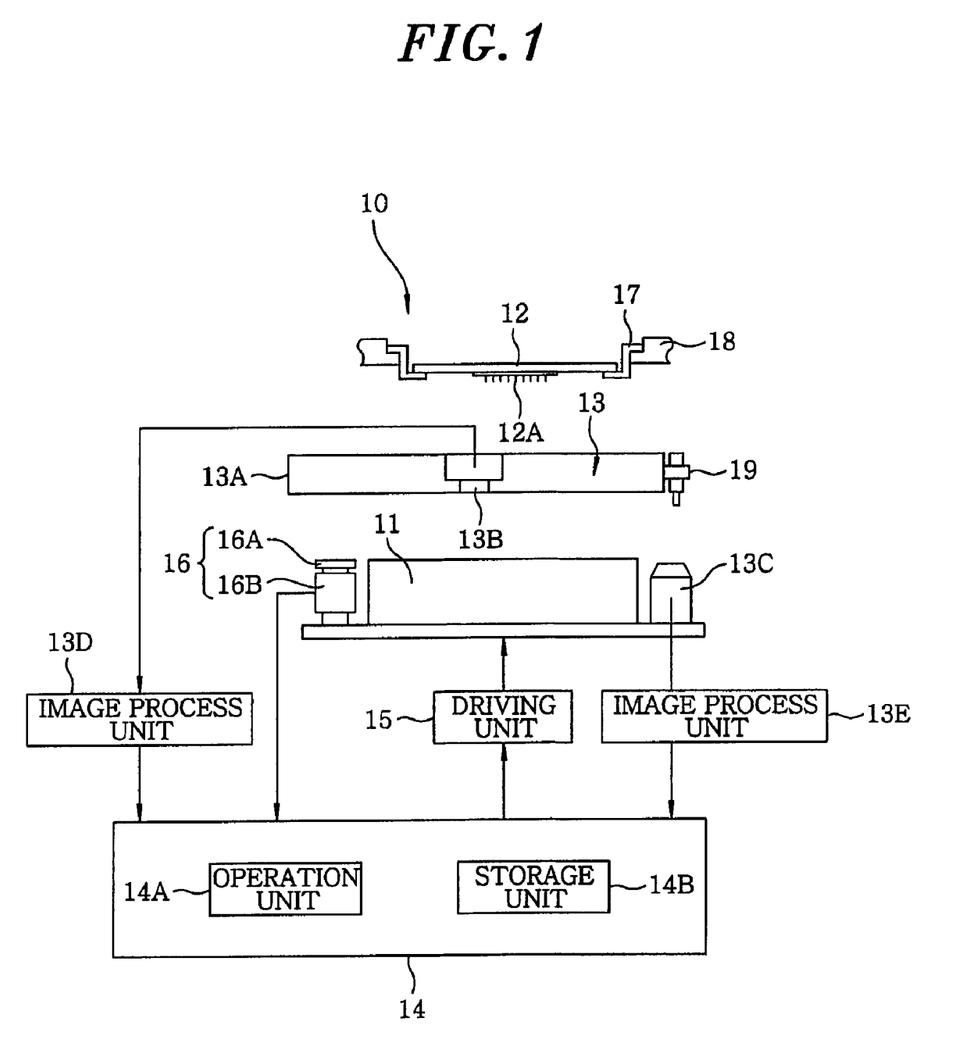
FIG. 1 is a schematic view of a probe apparatus in accordance with an embodiment of the present invention.

At first, a probe apparatus in accordance with the present invention will be described. A probe apparatus 10 in accordance with an embodiment of the present invention, as shown in FIG. 1 for example, has a movable mounting table 11 for mounting thereon a wafer (not shown) which is an object to be inspected, a probe card 12 arranged above the mounting table 11, an alignment device 13 for aligning a plurality of probes 12A of the probe card 12 and the wafer on the mounting table 11, and a control unit 14 for controlling various components including the mounting table 11 and the alignment device 13. Further, the probe apparatus 10 is configured in such a way that after the alignment device 13 operates to align the wafer on the mounting table 11 and the probes 12A of the probe card 12 under the control of the control unit 14, the probes 12A come in electric contact with the wafer to inspect electrical characteristics of the wafer.

The mounting table 11 is configured to be moved in directions of X, Y, Z and θ through a driving unit 15 operating under the control of the control unit 14. A load sensor 16 is arranged at a side of the mounting table, and is configured to detect a height of tips of the probes 12A, based on a load at the moment when the load sensor 16 comes in contact with the probe 12A through the alignment device 13. FIG. 1 describes the probe apparatus 10 including, for example single load sensor 16, but the probe apparatus 10 may include a plurality of load sensors. The probe card 12 is attached to a head plate 18 of a prober chamber through a card holder 17.

The alignment device 13 has an alignment bridge 13A moving horizontally, e.g., between a rear surface and a probe center in the prober chamber, a first imaging unit 13B (for example, a CCD camera) provided at the alignment bridge 13A, and a second imaging unit 13C (for example, a CCD camera) provided at a side of the mounting table 11. The first CCD camera 13B moves from the rear surface to the probe center through the alignment bridge 13A to be between the probe card 12 and the mounting table 11. While the mounting table moves in directions of X, Y, the first CCD camera 13B detects and images the electrodes to be inspected of the wafer from above, and an image process unit 13D performs an image processing to transmit image signals to the control unit 14.

After the alignment bridge 13A retreats to the rear surface in the prober chamber, while the mounting table 11 is moving in directions of X, Y under the probe card 12, the second CCD camera 13C detects and images the probes 12A in sequence from below the probe card 12, and an image process unit 13E performs an image processing to transmit image signals to the control unit 14. Further, a pin 19 having a spring therein is attached to the end of the alignment bridge 13A. The pin 19 comes in contact with the load sensor 16 to impart a specific load (for example, 30 gf±10%) thereto to thereby confirm whether or not the load sensor operates normally.

As shown in FIG. 1, the load sensor 16 provided at the side of the mounting table 11 includes a disc-shaped sensor unit 16A having therein a load sensor for detecting a specific load, and a cylinder mechanism 16B for moving the sensor unit 16A up and down. The sensor unit 16A moves up and down between a position lower than the mounting surface of the mounting table 11 and a position higher by about 4-5 mm than the mounting surface, for example. Further, the sensor unit 16A detects the tip of the pin 19 or the tips of the probes 12A when being placed at the raised position higher by about 4-5 mm than the mounting surface, for example.

Figure 2:
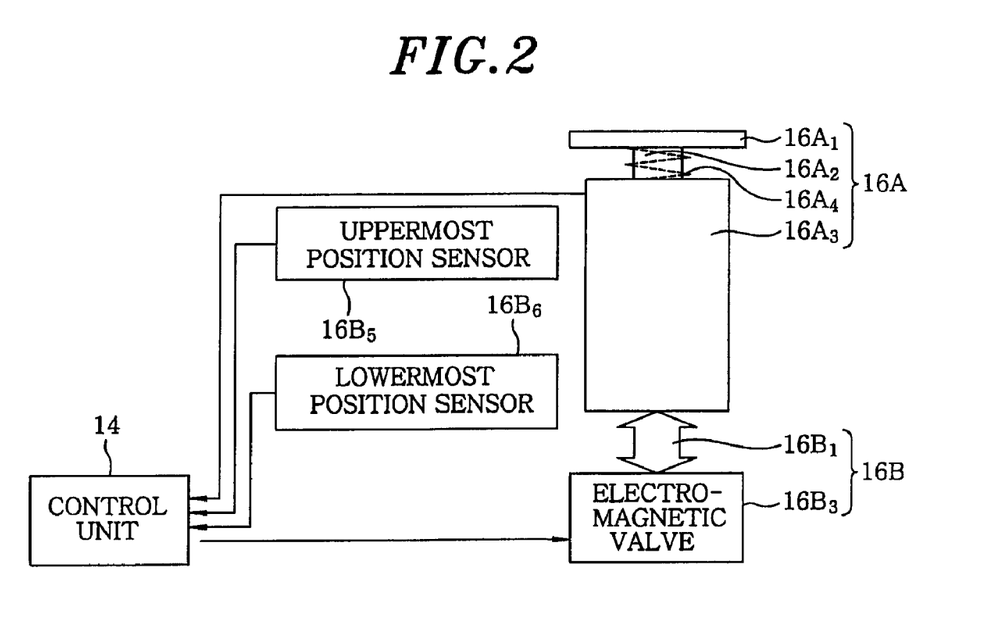
FIG. 2 is sets forth a schematic view showing a load sensor shown in FIG. 1.

The sensor unit 16A includes a disc-shaped sensor plate $16A_1$, a rod $16A_2$ extended from a bottom center portion of the disc-shaped sensor plate $16A_1$, a cylindrical body $16A_3$ having therein the load sensor and having in its top surface a though-hole through which a lower portion of the rod $16A_2$ is inserted thereinto, and a spring $16A_4$ installed between the top surface of the body $16A_3$ and the sensor plate $16A_1$, as shown in FIG. 2 for example. The sensor plate $16A_1$ descends elastically with respect to the top surface of the body $16A_3$ through the spring $16A_4$ when receiving a load, and the load sensor operates at a specific load (for example, 30 gf±10%).

Figure 3:
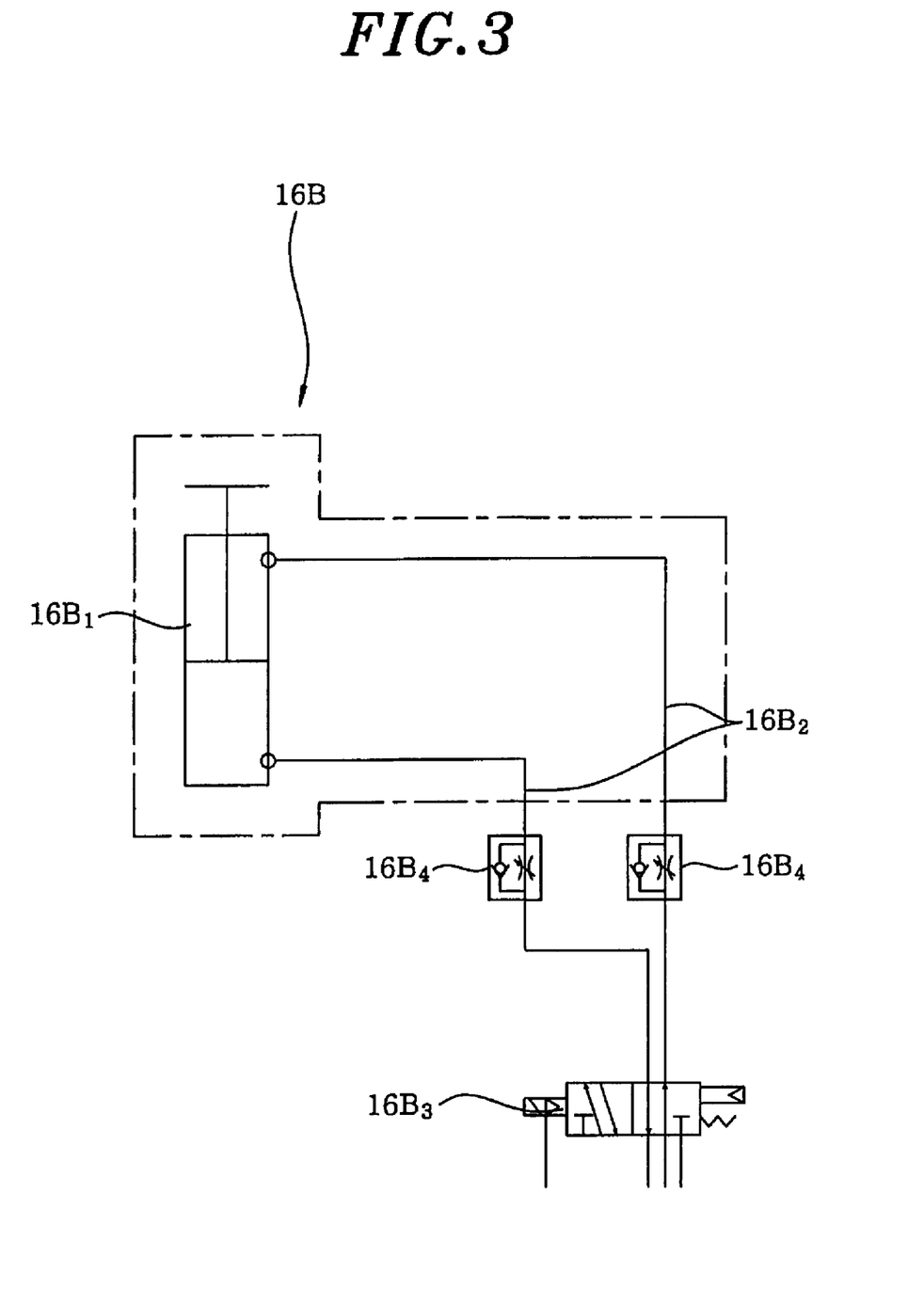
FIG. 3 depicts a block diagram showing an air control circuit of a cylinder mechanism of the load sensor.

The cylinder mechanism 16B has, as described in FIG. 3, an air cylinder $16B_1$, an electromagnetic valve $16B_3$ connected to the air cylinder $16B_1$ through air lines $16B_2$, two flow rate control valves $16B_4$ attached to the respective air lines $16B_2$ between the air cylinder $16B_1$ and the electromagnetic valve $16B_3$, and an uppermost position sensor $16B_5$ and a lowermost position sensor $16B_6$ (see FIG. 2) for respectively detecting an uppermost position and a lowermost position of the air cylinder $16B_1$, wherein the sensor unit 16A moves up and down by switching input and output ports for pressure air of the electromagnetic valve $16B_3$ to the air cylinder $16B_1$ under the control of the control unit 14. When the sensor unit 16A reaches the uppermost position or the lowermost position, the sensor $16B_4$ or $16B_5$ operates to make the electromagnetic valve $16B_3$ stop through the control unit 14.

The control unit 14 has an operation unit 14A and a storage unit 14B as described in FIG. 1. When the probe tip detecting method or the alignment method in accordance with the present invention is carried out, the operation unit 14A receives and transmits various information signals from and to each component unit of the probe apparatus 10 and performs various operation processes, and various informations such as operation results are stored in the storage unit 14B. The storage unit 14B has a main storage unit and a secondary storage unit. In the secondary storage unit, programs for respectively executing probe tips detecting method and an alignment method in accordance with the present invention are stored. The programs for probe tips detecting method and the alignment method in accordance with the present invention may be stored together in a same storage medium, or may be respectively stored in different storage mediums.

Next, embodiments of the probe tip detecting method and the alignment method in accordance with the present invention will be described with reference to FIGS. 4A to 4F.

The probe tip detecting method in accordance with the present embodiment is implemented, before performing the alignment of a wafer and probes, based on a storage medium stored in the storage unit 14B of the control unit 14. That is, in the method of the present embodiment, as described in FIG. 4A, the alignment bridge 13A of the alignment device 13 is moved to the probe center. Simultaneously, the mounting table 11 moves to find the pin 19 attached to the alignment bridge 13A by using the second CCD camera 13C. When the pin 19 is captured by the second CCD camera 13C, the mounting table stops and moves up from this position slowly, and the tip of the pin 19 is detected by the second CCD camera 13C focusing on the tip of the pin 19. The control unit 14 recognizes a height of the mounting table at that time and records it in the storage unit 14B. Further, since the focal lengths of the first and the second CCD camera 13B, 13C are recorded in advance, the operation unit 14A calculates a height of the tip of the pin 19, from the height of the mounting table 11 and the focal length of the second CCD camera 13C. The calculated result is recorded in the storage unit 14B together with the X, Y positions at that time.

In the load sensor 16, the electromagnetic valve $16B_3$ operates to move the cylinder unit 16B in response to signals from the control unit 14, so that the sensor unit 16A is raised. When the top surface of the sensor plate $16A_1$ of the sensor unit 16A reaches the uppermost position higher than the mounting surface, the electromagnetic valve $16B_3$ operates to stop supplying the pressure air based on signals from the uppermost position sensor $16B_5$ so that the sensor plate $16A_1$ is fixed at the uppermost position. Simultaneously, while the mounting table 11 moves, the first CCD camera 13B of the alignment bridge 13A finds the load sensor 16 provided at the mounting table 11. When a top image of the load sensor is captured by the first CCD camera 13B, the mounting table 11 stop moving, and the first CCD camera 13B detects the load sensor 16 by focusing on the top surface of the sensor unit 16A of the load sensor 16, as described in FIG. 4B. The control unit 14 recognizes a height of the mounting table 11 at that time as a height of the load sensor 16, and records the height in the storage unit 14B together with the X, Y positions at that time.

Figure 4A:
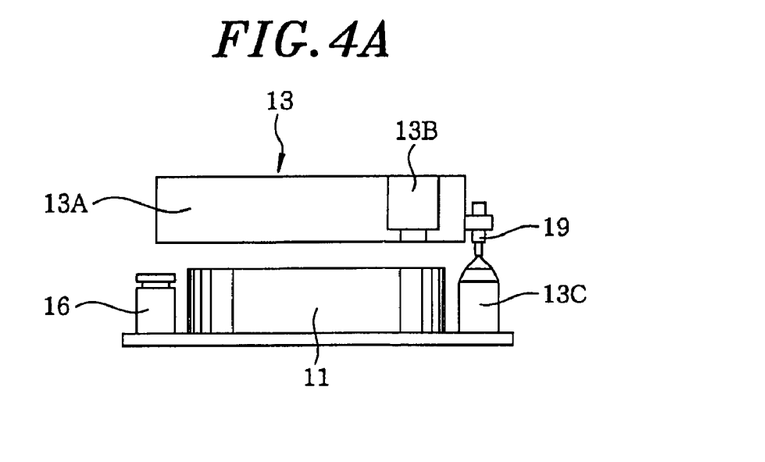
FIGS. 4A to 4F sequentially shows the processes of embodiments of a method for detecting tips of proves and an alignment method in accordance with the present invention.
Figure 4B:
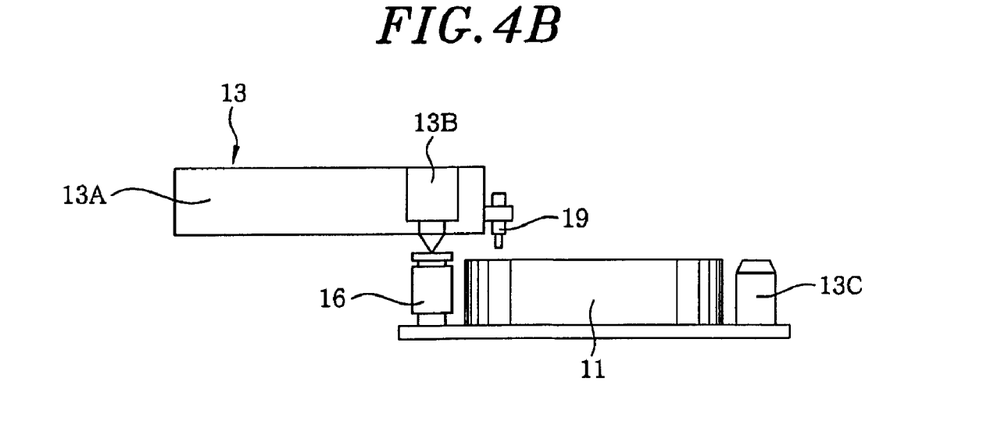
Figure 4C:
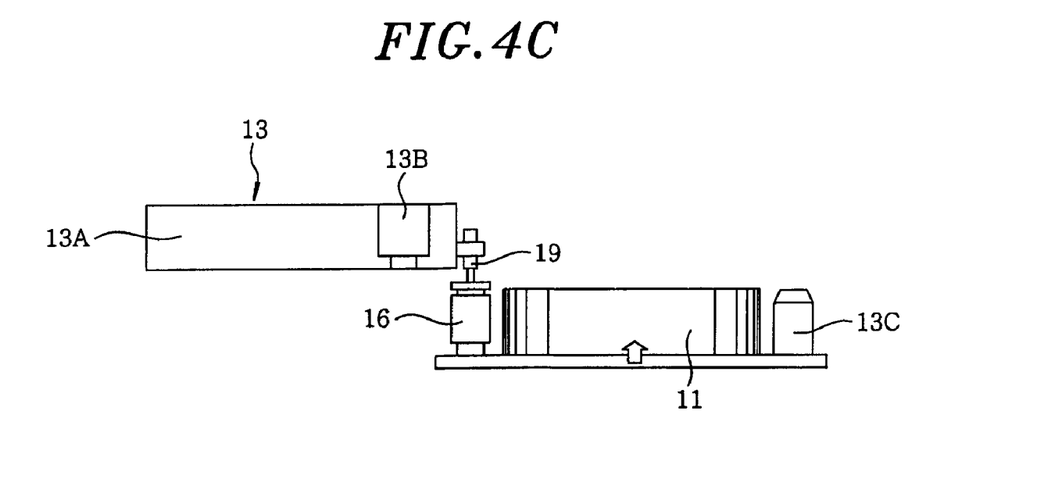

Subsequently, the load sensor 16 moves along with the mounting table 11 and stops at a position just under the pin 19. At this position, the load sensor 16 moves up along with the mounting table 11 to come in contact with the pin 19, so that a certain amount of load is applied to the load sensor 16. At this time, the sensor unit 16A moves down into the body $16A_3$ against the elastic force of the spring $16A_4$ and a load sensor (in this case, load switch sensor) operates to transmit signals to the control unit 14, so that the mounting table 11 stops moving up. In this way, it is possible to confirm whether the load sensor 16 functions normally.

Figure 4D:
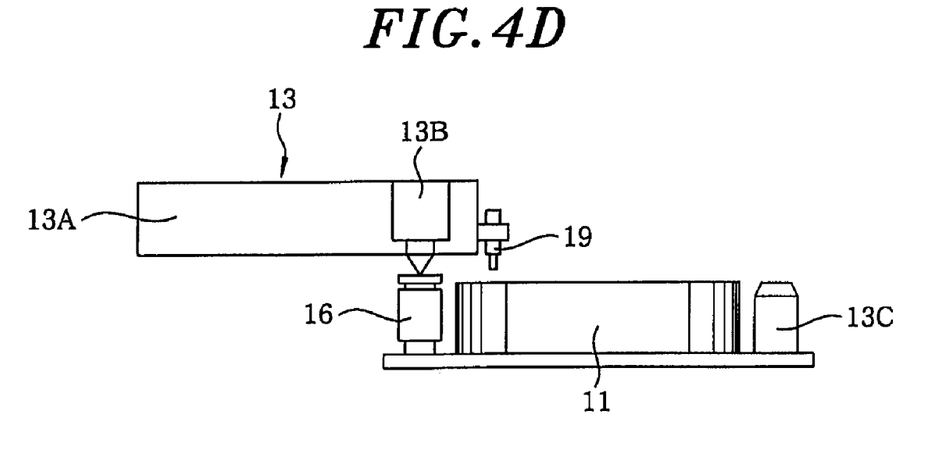

After confirming the operation of the load sensor 16, as described in FIG. 4D, while the load sensor 16 moves along with the mounting table 11, the first CCD camera 13B detects the load sensor 16 to find the height of the load sensor 16.

Figure 4E:
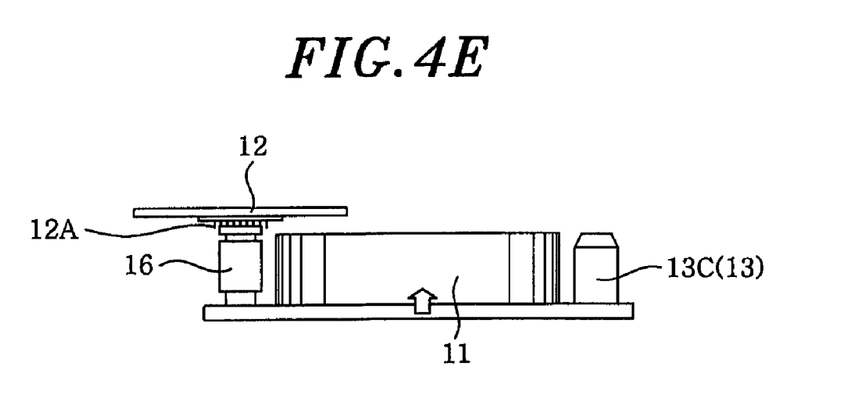

After the alignment bridge 13A retreats from the probe center under the control of the control unit 14, the load sensor 16 moves along with the mounting table 11 to arrive at a position just under the probe card 12, as described in FIG. 4E, and the mounting table 11 stops to ascend from the position so that the load sensor 16 comes in contact with the probe 12A. When detecting a specific amount of load, the load sensor 16 operates to stop the mounting table 11 through the control unit 14. A height of tips of the probes is determined from the height of the mounting table 11 and it is recognized by the control unit 14. The height of the tips of the probe 12A is recorded in the storage unit 14B.

The alignment method of the present invention is executed based on the storage medium stored in the storage unit 14B of the control unit 14, after the probe tip detecting method has been performed as described above. In the present embodiment, as described in FIG. 4F, after detecting a height of the tips of the probes 12A, the height is recorded in the storage unit 14B of the control unit 14. Subsequently, the second CCD camera 13C moves along with the mounting table 11 under the probe card 12 and stops at the target probe 12A. Since the mounting table 11 is at the height where the height of the tips of the probes 12A has been recognized, the second CCD camera 13C focuses on the tips of the target probes 12A. Accordingly, the tip position can be detected exactly, so that the precise alignment can be performed.

Figure 4F:
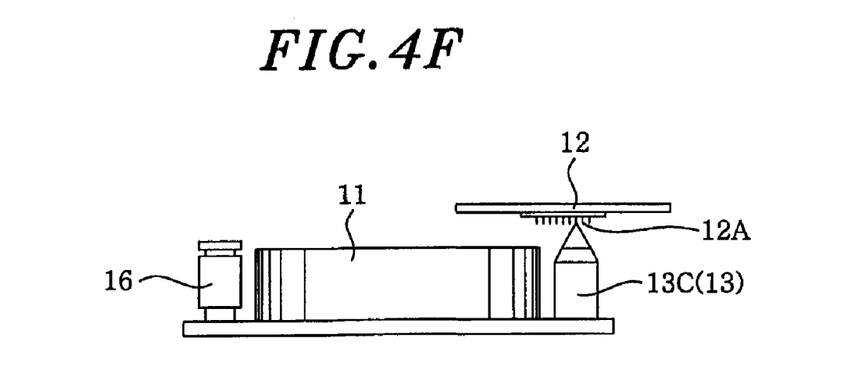

Even though it is difficult for the second camera 13C to focus on the tips of the probes 12A, since the control unit 14 has recognized the exact height of the tips of the probes 12A by the load sensor 16 in advance, the tip positions of the probes 12A (horizontal position and height) can be precisely detected by the second CCD camera 13C. This makes it possible to certainly carry out the alignment of the probes 12A without any damage to the probe card 12, even if there are deviations in heights of the tips of probes 12A in the probe cards 12 of a same type depending on manufacturers or even if other probe cards than a standard probe card are installed.

As described above, in accordance with the present embodiment, after detecting the height of the load sensor 16 provided at the mounting table 11 by using the first CCD camera 13B of the alignment device 13, the load sensor 16 is made to come in contact with the probes 12A by moving the mounting table 11 and the height of the tips of probes 12A is detected based on the moving amount of the mounting table 11. Therefore, even in case of probe cards 12 having a difficulty in optically detecting tips of probes 12A, or having deviation in the heights of the probes when manufactured, or not being properly installed, the height of the tips of the probes 12A in each probe card 12 can be detected certainly.

Further, in accordance with the present embodiment, since the operation of the load sensor 16 is confirmed by using the pin 19 after detecting the height of the load sensor 16 and before detecting the height of the tips of the probes 12A, the height of the tips of the probes 12A can be detected more surely without any malfunction of the load sensor 16. Since the second CCD camera 13C detects the height of the pin 19 before detecting the height of the load sensor 16, it is possible to make the load sensor 16 contact with the pin 19 under a specific load. Further, since the height of the load sensor 16 is detected again after the pin 19 checks the operation of the load sensor 16, the height of the tips of the probes 12A can be detected more precisely.

Further, in accordance with the present embodiment, the mounting table 11 moves to make the load sensor 16 provided at the mounting table 11 come in contact with the probes 12A, and the height of the tips of the probes 12A is calculated based on the moving amount of the mounting table 11. Then, the mounting table 11 moves and the second CCD camera 13C detects the height of the tips of the probes 12A at the position where the height of the tips of the probes 12A has been calculated. Therefore, when alignment is preformed, the second camera 13C can focus on the tips of probes 12A so that the exact height of the probes 12A can be imaged and detected, thereby performing with a high precision.

Further, in accordance with the present embodiment, since each method of the present embodiment is recorded in the storage medium, by storing the storage medium in the storage unit 14B of the control unit 14, the height of the tips of probes can be detected precisely and exactly.

Further, in accordance with the present embodiment, the load sensor 16 has the sensor unit 16A for detecting a load, the cylinder mechanism 16B for moving the sensor unit 16A up and down between the uppermost position and the lowermost position, and the sensors $16B_5$ and $16B_6$ for detecting the uppermost position and the lowermost position of the sensor unit 16A. Further the sensor unit 16A has the sensor plate $16A_1$ which receives a load at the uppermost position to move elastically and the body $16A_3$ having therein the load sensor pressed by the downward movement of the sensor plate $16A_1$. Therefore, the operation thereof is stable, which enhances the detecting reliability of the tips of the probes 12A.

Further, the present invention is not limited to the embodiments as described above and each component may be modified properly as desired. For example, in the aforementioned embodiments, there has been described the load sensor working elastically, but a load sensor which does not work elastically may be employed.

The present invention can be appropriately utilized in a probe apparatus for inspecting electrical characteristics of an object to be inspected such as a semiconductor wafer.

While the invention has been shown and described with respect to the embodiments, it will be understood by those skilled in the art that various changes and modifications may be made without departing from the scope of the invention as defined in the following claims.

What is claimed is:

1. A method for detecting a height of a tip of a probe before detecting a horizontal position of the tip of the probe by using an alignment device having a first imaging unit and a second imaging unit provided at a movable mounting table, the method comprising the steps of:
   (a) detecting a height of a load sensor provided at the mounting table by using the first imaging unit; and
   (b) moving the mounting table to make the probe come in contact with the load sensor and detecting the height of the tip of the probe based on a moving amount of the mounting table,
   wherein the method further comprises, between the steps (a) and (b), the step of (c) moving the mounting table to make the load sensor come in contact with a pin confirming whether the load sensor detects a load applied by the pin.

2. The method of claim 1, wherein a height of the pin is detected by using the second imaging unit prior to the step (c).

3. The method of claim 1, further comprising the step of confirming the height of the load sensor again by using the first imaging unit.

4. A computer-executable storage medium for performing the method described in claim 1.

5. The method of claim 1, wherein the step of (c) includes the step of: stopping the mounting table upon detecting that the load is applied to the load sensor by the pin.

6. The method of claim 1, wherein the pin is provided at an alignment bridge to which the first imaging unit is installed.

7. The probe apparatus of claim 1, wherein the load sensor includes a body, a load receiving part, and a spring installed between the body and the load receiving part, wherein the load receiving part moves elastically toward the body when the load receiving part contacts the pin or tips of the probes, and wherein the body has a load switch sensor therein for detecting the load applied to the load receiving part and stopping the mounting table.

8. An alignment method for performing position alignment of a plurality of probes arranged above a movable mounting table by using an alignment device having a first imaging unit and a second imaging unit provided at the movable mounting table, the method comprising the steps of: (a) moving the mounting table to make a load sensor provided at the mounting table come in contact with the probes and detecting a height of tips of the probes based on a moving amount of the mounting table; and (b) moving the mounting table based on the height of the tips of the probes and detecting a horizontal position of the tips of the probes by using the second imaging unit, wherein the method further comprises, prior to the step (a), the step of (c) detecting a height of the load sensor by using the first imaging unit, and wherein the method further comprises, between the steps (a) and (c), the step of (d) moving the mounting table to make the load sensor come in contact with a pin and confirming whether the load sensor detects a load applied by the pin.

9. The method of claim 8, wherein a height of the pin is detected by using the second imaging unit prior to the step (d).

10. The alignment method of claim 8, further comprising the step of confirming the height of the load sensor again by using the first imaging unit.

11. A computer-executable storage medium for performing the method described in claim 8.

12. The method of claim 8, wherein the step (d) includes the step of: stopping the mounting table upon detecting that the load is applied to the load sensor by the pin.

13. The method of claim 8, wherein the pin is provided at an alignment bridge to which the first imaging unit is installed.

14. The probe apparatus of claim 8, wherein the load sensor includes a body, a load receiving part, and a spring installed between the body and the load receiving part, wherein the load receiving part moves elastically toward the body when the load receiving part contacts the pin or tips of the probes, and wherein the body has a load switch sensor therein for detecting the load applied to the load receiving part and stopping the mounting table.

15. A probe apparatus comprising: a movable mounting table for mounting thereon an object to be inspected; a plurality of probes arranged above the mounting table; an alignment device for performing position alignment of the probes and the object to be inspected placed on the mounting table, wherein the alignment device includes a first imaging unit and a second imaging unit provided at the mounting table; a load sensor provided at the mounting table; and a pin configured to confirm whether the load sensor detects a load applied by the pin when the mounting table is moved to make the load sensor come in contact with the pin.

16. The probe apparatus of claim 15, wherein the load sensor includes a body, a load receiving part, and a spring installed between the body and the load receiving part, wherein the load receiving part moves elastically toward the body when the load receiving part contacts the pin or tips of the probes, and wherein the body has a load switch sensor therein for detecting the load applied to the load receiving part and stopping the mounting table.

17. The method of claim 15, wherein the pin is provided at an alignment bridge to which the first imaging unit is installed.

* * * * *